(12) United States Patent
Brehm et al.

(10) Patent No.: US 9,382,149 B2
(45) Date of Patent: Jul. 5, 2016

(54) METHODS FOR PRODUCING A SEMIFINISHED PART FOR THE MANUFACTURE OF AN OPTICAL FIBER WHICH IS OPTIMIZED IN TERMS OF BENDING

(75) Inventors: Lothar Brehm, Jena (DE); Matthias Auth, Essen (DE); Jörg Kötzing, Jena (DE)

(73) Assignee: j-plasma GmbH, Jena (DE)

( * ) Notice: Subject to any disclaimer, the term of this patent is extended or adjusted under 35 U.S.C. 154(b) by 0 days.

(21) Appl. No.: 14/123,085

(22) PCT Filed: May 10, 2012

(86) PCT No.: PCT/EP2012/058599
§ 371 (c)(1),
(2), (4) Date: Aug. 14, 2014

(87) PCT Pub. No.: WO2012/163644
PCT Pub. Date: Dec. 6, 2012

(65) Prior Publication Data
US 2015/0043880 A1   Feb. 12, 2015

(30) Foreign Application Priority Data

May 27, 2011   (DE) .......................... 10 2011 110 246
Nov. 11, 2011  (DE) .......................... 10 2011 118 268

(51) Int. Cl.
| | | |
|---|---|---|
| *C03B 37/018* | (2006.01) | |
| *C03B 37/012* | (2006.01) | |
| *C03B 37/014* | (2006.01) | |
| *C23C 16/22* | (2006.01) | |
| *G02B 6/036* | (2006.01) | |

(52) U.S. Cl.
CPC ......... *C03B 37/01869* (2013.01); *C03B 37/014* (2013.01); *C03B 37/018* (2013.01); *C03B 37/01211* (2013.01); *C03B 37/01228* (2013.01); *C03B 37/01237* (2013.01); *C03B 37/01493* (2013.01); *C03B 37/01892* (2013.01); *C23C 16/22* (2013.01); *G02B 6/036* (2013.01); *C03B 2201/02* (2013.01); *C03B 2201/12* (2013.01); *C03B 2201/31* (2013.01); *C03B 2203/04* (2013.01); *C03B 2203/12* (2013.01); *C03B 2203/22* (2013.01); *C03B 2203/23* (2013.01); *Y02P 40/57* (2015.11)

(58) Field of Classification Search
USPC .................................... 65/419, 403, 421, 428
IPC .................... C03B 37/018,37/014; C23C 16/22
See application file for complete search history.

(56) References Cited

U.S. PATENT DOCUMENTS

2006/0204189 A1   9/2006   Sasaki et al.

FOREIGN PATENT DOCUMENTS

| DE | 102006031898 | 7/2006 |
|---|---|---|
| DE | 102011118268 | 11/2011 |
| EP | 1256554 | 11/2002 |
| EP | 1388525 | 2/2004 |
| JP | 2001192233 | 7/2001 |
| WO | 0172648 | 10/2001 |
| WO | 2011110617 | 9/2011 |
| WO | 2012163644 | 12/2012 |

*Primary Examiner* — Mark Halpern
(74) *Attorney, Agent, or Firm* — Kuta Intellectual Property Law, LLC; Christine M. Kuta

(57) ABSTRACT

Methods for producing a semifinished part for the manufacture of an optical fiber are disclosed. The methods are optimized in terms of bending. The methods include the steps of providing a shell tube with a shell refractive index which is lower in relation to the light-conducting core. Then, at least one protective, intermediate and/or barrier layer is applied to a radially outermost and/or innermost tube surface of the respective shell tube, wherein a build-up of light-conducting layers is realized on the inner side and/or the outer side of the shell tube. Finally, the shell tubes are joined by collapsing so as to form the semifinished part.

17 Claims, 3 Drawing Sheets

METHODS FOR PRODUCING A SEMIFINISHED PART FOR THE MANUFACTURE OF AN OPTICAL FIBER WHICH IS OPTIMIZED IN TERMS OF BENDING

This application is a 371 of PCT/EP2012/058599 filed 10 May 2012

BACKGROUND

Bend-optimized optical fibers have properties adjusted to the purpose of use, especially an adjusted optimization according to the ability to guide light. This includes fibers which are designed to be highly bend sensitive, e. g. sensor fibers in optical bending sensor devices or optical fibers which are designed to be highly bend insensitive, e. g. optical fibers for the transmission of high data rates with a large bandwidth.

Bend-optimized optical fibers usually have a structured radial refractive index profile. This profile includes trench structures, regions with graded refractive index, or complex combinations of several trenches of different widths separated by regions with increased refractive index. It is typically very complicated to produce such fibers with the conventional chemical and/or physical deposition methods, i.e. OVD methods, because the deposition parameters are typically very difficult to reproduce during these OVD methods, especially during plasma outside vapor deposition (POVD). In conventional methods, the most complex refractive index region is deposited in the last process step, which can result in the loss of the complete semifinished product. The semifinished product is also known as a preform.

It remains desirable to have a more reliable method for making bend-optimized optical fibers and improved bend-optimized optical fibers.

SUMMARY

The present invention is directed to economic and effective methods for the manufacture of a semifinished product for the production of bend-sensitive optical fibers and for the resulting fibers having a predictable refractive index profile that are also efficiently produced.

The task is solved by a method for the production of a semifinished product for the production of a bend optimized optical fiber, the method including the steps of providing a cladding tube having an inner surface and an outer surface and then forming a protective layer on the cladding tube. The protective layer may be formed on the inner surface of the cladding tube or the outer surface of the cladding tube. A light-guiding layer is then formed on the protective layer. The cladding tube is then collapsed to form the semi-finished optical product. In an alternative embodiment, the cladding tube is collapsed only partially. This method enables complex structures to be formed earlier in the process of forming an optical fiber. Also, the various layers enable more stable fiber to be made from a wider variety of glass types with greater control of the refractive indices.

In an alternative embodiment, at least one cladding tube with a refractive index below the refractive index of the light guiding core is provided. At least one protective, intermediate and/or barrier layer is applied to the outer and/or inner surface of the at least one cladding tube. Then a light guiding layer are deposited on the inner or outer surface of the at least one cladding tube. The cladding tube produced is at least partly collapsed and/or collapsed onto another substrate to yield a capillary or rod.

In a further alternative embodiment, assemblies of cladding tubes are collapsed where a rod is used as the substrate. This results in the formation of a semifinished product, wherein the chemical composition of the single cladding tubes may be different. In a still further alternative embodiment, the cladding tube is a fluorine doped quartz tube. The fluorine doping results in a reduction of the refractive index of the cladding tube. In an alternative arrangement, the fluorine containing layer is deposited onto an undoped quartz tube with the desired thickness and refractive index and is covered by another layer of undoped quartz as protective layer.

In various alternative embodiments, the deposition of the light guiding layers is achieved by using chemical vapor deposition (CVD), modified chemical vapor deposition (MCVD) and/or outside vapor deposition (OVD), plasma or flame pyrolysis methods.

The protective, intermediate and/or barrier layer is preferably formed of a fused silica glass with a higher melting point than the melting point of the cladding tube. This results in an increased stability of the semifinished product and ovalities and excentricities are reduced.

Furthermore, the protective, intermediate and/or barrier layer has another function in some embodiments. The protective, intermediate and/or barrier layer in one embodiment has a chemical composition which minimizes the differences of chemical and/or physical properties, e.g. thermal expansion coefficient and/or different chemical compositions, during the collapsing of the semifinished product onto a substrate. Therefore these layers can be generated using different transition glasses with different chemical compositions. This reduces or sets stress to the desired level in the resulting optical system.

After the formation of the light guiding layers, a deposition of at least one further inner and/or outer protective, intermediate and/or barrier layer can be carried out. In that way, the modified cladding tube is prepared on either the inside or outside or both sides in a correct manner.

In another alternative embodiment, the surrounding and/or inner pressure of the cladding tube is adjusted, i.e. controlled, by a pressure control system. Afterwards in one alternative arrangement, the cladding tube is collapsed to a capillary or a rod. This modified tube may then be collapsed onto another substrate after the deposition of the lightguiding layers. The further substrate can be either a rod or another cladding tube. In another embodiment the collapsing step is at least a partial collapse and it is carried out after the deposition of the light guiding layers to form a capillary or a massive rod. After the partial collapse, a mechanical treatment forming a polygonal rod can be carried out.

The collapsing steps can be also carried out successively. In one embodiment, a subsequent collapsing step of at least one doped and/or undoped cladding tube or semifinshed product is carried out. When doped cladding tubes are collapsed, the chemical composition of at least one dopant of each substrate can have a constant, linear and/or graded radial profile. By such processing, different refractive index profiles, especially trenches, graded or constant refractive index regions can be applied radially in an outward direction or combined with each other. This processing can be combined with at least one another outside deposition step.

In further alternative embodiments, the protective, intermediate and/or barrier layers are partially removed. It is preferred to combine glasses with equal or similar chemical composition during the collapsing processes. The protective, intermediate and/or barrier layer can have a chemical composition which reduces the chemical and/or physical differences between the semifinished product and the substrate, particularly differences in thermal expansion coefficient and/or different chemical compositions. With presently disclosed embodiments, layers are successfully produced using at least one transition glass with different chemical composition. This increases the yield of the process step since at least parts of the glasses can be used as transition glasses. In a final processing step at least one of the protective, intermediate and/or barrier layer may be at least partly removed. This induces diffusion processes within the inner structure which result in further modifications of the refractive index profile.

The process steps mentioned can be accompanied by surface treatment methods. In an intermediate and/or final process step a surface treatment is carried out, the surface treatment being preferably a fire polish and/or plasma polish step.

The method is to be described more in detail based on the following embodiments. Embodiments are illustrated in the figures wherein same parts are similarly labeled. The present invention together with the above and other advantages may best be understood from the following detailed description of the embodiments of the invention illustrated in the drawings, wherein:

DRAWINGS

DESCRIPTION

Methods for the production of a semifinished product for the manufacture of a bend-optimized optical fiber and the resulting optical fibers are disclosed.

Figure 1:
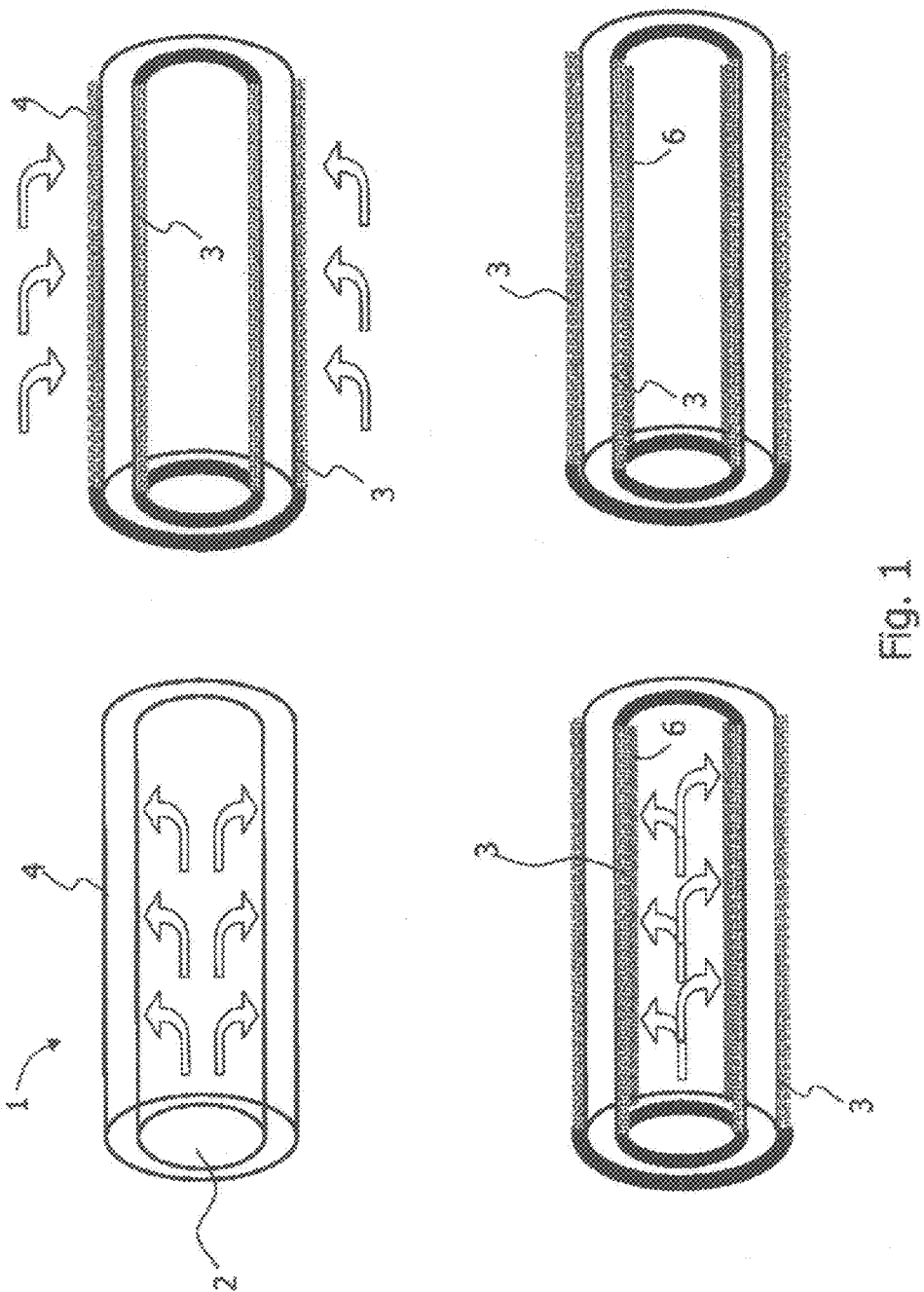
FIG. 1 shows exemplary processing steps in producing a semi-finished product according to principles of the invention.

FIG. 1 shows a series of exemplary processing steps for processing a cladding tube 1 in order to make a first semifinished optical product, or "part" according to embodiments of the invention. The cladding tube 1 is, in this example, a quartz tube having a defined thickness. The quartz glass is doped with at least one dopant that changes the refractive index of the glass. The dopant may be, for example, one or more of the following: fluorine, fluorine containing compounds, germanium, phosphorus, aluminum, boron or other halogens and their compounds or other substances. The refractive index of the cladding tube 1 is designed to be lower than the refractive index of the core of the resulting fiber.

The cladding tube 1 is a substrate for the deposition processes and surface modifications that carried out in the next processing steps. The cladding tube has an inner surface 2 and an outer surface 4. In a first step, a protective, intermediate or barrier layer 3 is deposited on the inside (i.e., the inner surface) and/or outside (i.e., the outer surface) 2, 4 of the cladding tube 1. For convenience, the protective, intermediate or barrier layer will also be referred to as "the protective layer." The material of the protective layer is selected so that the protective layer is substantially impermeable to the dopants within the cladding tube. The protective layer covers the surface of the cladding tube 1 substantially equally. It tends to prohibit diffusion of the refractive index changing dopants out of the quartz glass matrix of the cladding tube during the next processing steps.

To carry out the deposition known deposition methods are used. These methods are, for example, wet-chemical dip coating, and deposition processes from vapor or gas phases known as chemical vapor deposition (CVD). During the wet-chemical dip coatings, the cladding tube is either completely dipped in a dipping bath or streamed by a deposition solution on the inside of the cladding tube. To carry out the CVD processes, the cladding tube is locally heated from the outside and streamed by a gas flow on the inside. The gas flow contains the substances for the deposition layer in dispersed form. These substances deposit thermophoretically on the locally heated area of the cladding tube. For the deposition of the complete inner surface of the cladding tube, the position of the local heating is displaced along the tube to yield an equal inside deposition with the protective, intermediate and barrier layer 3. The protective, intermediate and barrier layer 3 is, for example, made of quartz glass with a melting point above the melting point of the cladding tube. Thereby the protective layer has a stabilizing function in addition to a barrier function.

Furthermore, the inside and outside deposited protective, intermediate and barrier layer 3 serves as an adhesive layer and/or compensating intermediate layer which minimizes the differences of the expansion coefficients of the material of the cladding tube on the one side and the layers deposited onto the protective layer 3 on its other side. To deposit the protective, intermediate and barrier layer, a CVD method is used.

The cladding tube 1 modified with the protective layer can be used for further deposition steps on the inside or outside. In the present example, lightguiding layers 6 are deposited on the inside of the cladding tube. The lightguiding layers can be doped with for example, germanium. The cladding tube with the protective layer is the starting structure for the lightguiding structure within the optical fiber. For the inner as well as the outer deposition, similar deposition methods for depositing the lightguiding layers as for the deposition of the protective layer can be used.

Parallel to the described first semifinished product, other semifinished products are produced, that is, a second and third semifinished product and a core doped with germanium.

The second semifinished product differs from the first semifinished product in the order of the deposition steps. The second semifinished product contains a fluorine doped cladding tube with a protective intermediate and barrier layer on outer surface of the cladding tube and a germanium doped layer on the inside.

The third semifinished product contains a fluorine doped cladding tube as well which has a protective layer on its inside only.

For an outside deposition, it is preferable to use a plasma deposition process. For this, the cladding tube is positioned in the flame region of a moveable plasma burner and rotated. Within the flame of the plasma burner, substances for the deposition of outer lightguiding materials are added. These are deposited on the outside of the cladding tube.

The inside as well as the outside of the cladding tube may be treated with additional deposition processes. The number of layers that may be deposited on the surfaces of the cladding tube is in theory not limited. Complex structures can be accomplished particularly using deposition processes on the inside of the cladding tube. According to the desired structure of the semifinished product or the optical fiber produced therefrom, further modifications of the semifinished product may be carried out. In particular, another protective, intermediate and barrier layer may be deposited on the outside of the cladding tube. Alternatively, the semi-finished product may be processed to change its shape. This includes flattening, or processing the circular outer shape to a polygonal, hexagonal, octagonal or quadratic shape. Further alternatively, depressions or grooves may be formed along the cladding tube. Such modifications may be carried out by local etching, laser treatment or sputter processes.

The additional production processes of the cladding tube depend on the location of the cladding tube within the semi-finished product. Using the cladding tube in the core area of the semifinished product, a collapsing step of the cladding tube may be carried out, wherein the cladding tube is collapsed to a massive rod. This collapsing process can be carried out in a controlled way. The pressure difference between the inside and outside of the cladding tube is set up to collapse the cladding tube with a controllable speed and/or to a controllable radius. This pressure difference can be generated either by using an underpressure inside the tube or an overpressure outside the tube.

In another alternative embodiment, the semifinished product is produced from several single tubes and/or a rod or capillary within a convergent production process. This means that several cladding tubes and the rod with different sizes and depositions are produced at the same time and combined in a final production process, where the several independent production steps of the cladding tubes converge to a final step in which all the tubes and the rod are combined.

Figure 2:
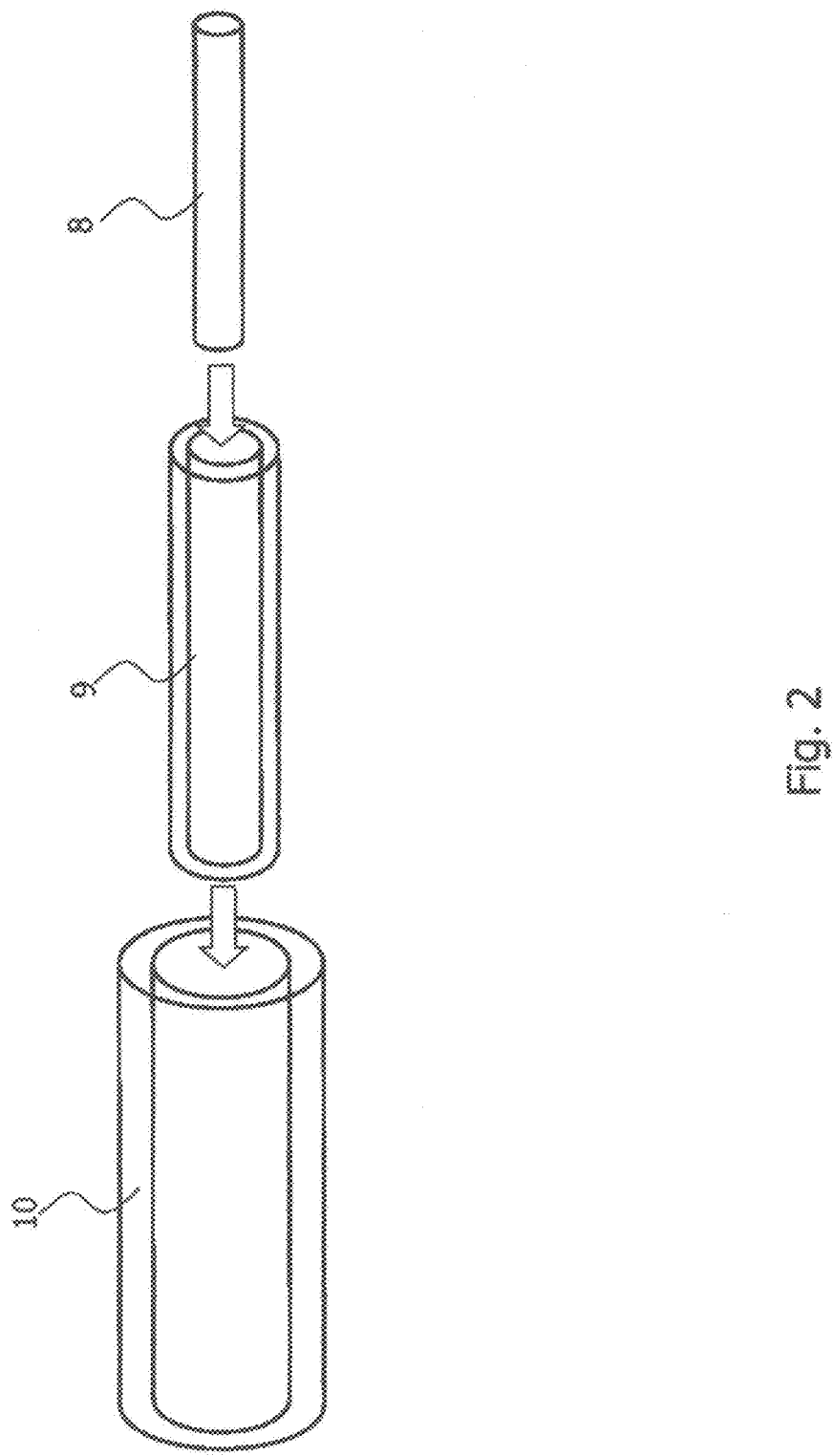
FIG. 2 is an illustration of a method of merging several cladding tubes and a massive rod to form a semi-finished product for the production of optical fibers according to one embodiment of the invention.

FIG. 2 shows the final combining production process for the manufacture of the semifinished product in this alternative embodiment. In this case, the core rod 8, a middle cladding tube 9 and an outer cladding tube 10 are used. Each of these cladding tubes 9, 10 can have the aforementioned inner and/or outer depositions in different shapes and modifications. It is possible as well that at least one of the cladding tubes has a cross section deviating from circular geometry.

The combination of the cladding tubes 9, 10 is carried out as a series of collapsing processes. The core rod 8 is used as a starting substrate. In this example, the starting substrate is a prior collapsed cladding tube. In alternative embodiments, the starting substrate is a massive rod.

The core rod 8 and the middle cladding tube 9 are fitted into each other. Subsequently, the middle cladding tube is collapsed onto the core rod. This collapsing process can be carried out either spontaneously or under controlled conditions with a defined pressure difference. The protective, intermediate and barrier layer on the inside of the middle cladding tube or outside of the core rod are of importance. These induce a tension reduction or tension compensation during the collapsing process.

The same collapsing process takes place with the middle cladding tube 9 and the outer cladding tube 10 to form the semifinished product. In this case, the middle cladding tube collapsed on the core rod is now the substrate for the collapsing of the outer cladding tube. The resulting semifinished product is a concentrically layered structure with different refractive index areas induced by the base material of the cladding tubes and their inner and outer depositions, which either merge gradually or stepwise to each other and form trench or step structures particularly in the region of the depositions of the cladding tubes, which yield refractive index trench structures after drawing of the optical fiber, which are designed for the bend sensitivity of the optical fiber.

The semifinished product can be treated by a plasma and/or fire polish and/or a temperature treatment as a whole to yield a semifinished product substantially free of tension with a substantially flawless surface.

Alternative embodiments for the production of the single parts and the resulting semifinished product are described below.

Figure 3:
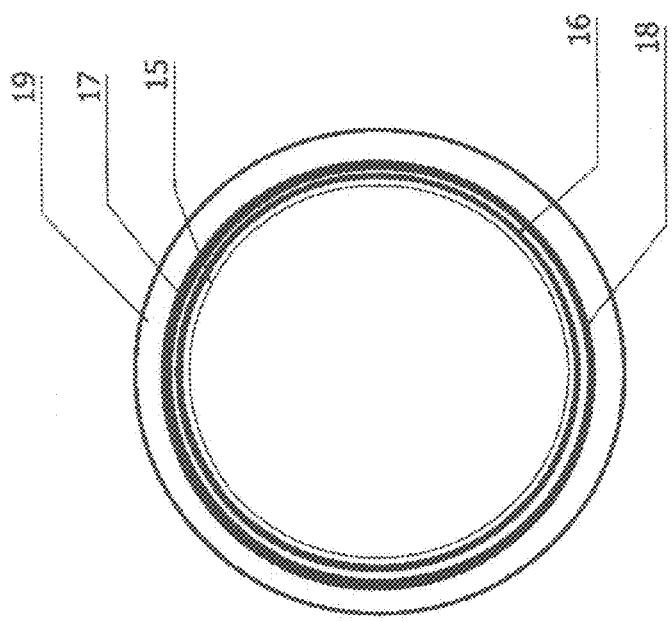
FIG. 3 shows an embodiment of a cladding tube according to principles of the invention.

FIG. 3 shows a preferred embodiment of a cladding tube containing an inner protective layer 15, a depressed refractive index trench 16, an undoped or doped intermediate layer 17, another depressed refractive index trench 18 and an outer protective layer 19.

Figure 4:
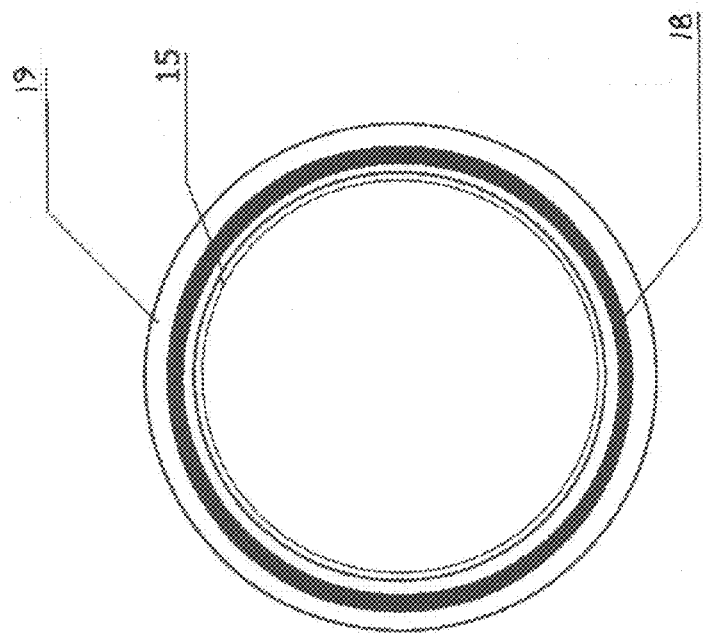
FIG. 4 shows an alternative embodiment of a cladding tube according to principles of the invention.

FIG. 4 describes an advantageous embodiment of a cladding tube containing an inner protective layer 15, a depressed refractive index trench 18 and an outer protective layer 19. The outer diameter of this embodiment is, for example, 30 to 40 mm, the inner diameter is, for example, 25 to 35 mm.

In manufacturing the tube, an auxiliary material is provided in the first step. This is preferably a graphite or SiC-rod, however, any other heat and temperature resistant material can be used. In this example, a graphite rod is used.

In the next step, the graphite rod is provided with an inner protective layer 15 with a wall thickness of 1-2 mm, preferably 1.5 mm, which is either collapsed onto the graphite rod as a substrate tube or directly deposited. This inner protective layer preferably consists of undoped quartz glass, and it can contain at least one dopant according to the application of the optical fiber. Subsequently, a fluorine doped trench 18 with a wall thickness of 1.5-2.5 mm, preferably 2 mm and a refractive index depression $\Delta n$ between −0.005 and −0.026 preferably −0.009, is deposited with deposition processes, such as the POVD or MCVD method or the so called smoker.

Afterwards, an outer protective layer with 0.2-3 mm, preferably 1 mm, is applied either by collapsing a tube with the desired glass composition or by direct deposition with the aforementioned methods.

After the removal of the auxiliary material—in the present case a graphite rod—a processing and/or cleaning and/or temperature treatment of the inner surface is performed.

This procedure is followed by an elongating process to make a tube with an outer diameter between 24 and 36 mm, preferably 32 mm. In this tube, the lightguiding layers are deposited using a CVD or PIVD method, such that the refractive index is continuously increased from a certain layer number. The resulting tube is collapsed to a capillary or massive rod.

The resulting product is either jacketed with a tube with a desired refractive index and wall thickness or directly deposited with further layers of desired refractive index and wall thickness after the outer surface has been polished. This yields the correct core to clad ratio in the resulting optical fiber.

In another embodiment, the auxiliary material is first provided. The auxiliary material is for example either graphite or SiC, however, any other heat or temperature resistant material can be used. In the present embodiment, a graphite rod with an outer diameter of 43 mm is used.

In the next step, the graphite rod is deposited with a glass soot layer with desired refractive index. After this step, the deposition of the inner protective layer 15 is performed, the inner protective layer 15 preferably consisting of undoped quartz glass with a thickness of 0.2 to 1.2 mm, and preferably 0.7 mm. Then, a first doped trench 16 with a wall thickness of 0.2-1.3 mm, preferably 0.7 mm, and a refractive index deviation $\Delta n$ between 0.001 and −0.005, preferably 0.0025, is deposited with deposition methods such as POVD, MCVD or smoker.

Another intermediate quartz glass layer with a wall thickness of 0.01 and 2.5 mm, preferably 0.7 mm, is deposited using one of the aforementioned methods. The additional intermediate quartz glass layer may be either undoped quartz glass or doped quartz glass with a refractive index difference $\Delta n2 = -\Delta n +/- 0.001$.

Subsequent to this intermediate layer 17, a fluorine doped trench 18 with a wall thickness of 0.3-2.5 mm, preferably 1.0 mm, and a refractive index depression $\Delta n$ between −0.005 and −0.026, preferably −0.009, is deposited. The other process steps are similar to the first embodiment.

In another embodiment, an auxiliary material for the tube production is provided, where this auxiliary material is preferably a graphite or SiC-rod. Alternatively, any other heat and temperature resistant material can be used. In the present example, a graphite rod with an outer diameter of 43 mm is used.

In the next step, the graphite rod is deposited with a glass soot layer having a desired refractive index. This layer is at least partially sintered to a transparent glass layer by the proceeding deposition processes. Afterwards, a fluorine doped trench 18 is built with a wall thickness of 0.4-2.5 mm, preferably 1.5 mm, and a refractive index depression $\Delta n$ between −0.004 and −0.026, preferably −0.009. The fluorine doped trench is formed with deposition processes, such as the POVD or MCVD or smoker. This tube is covered with an outer protective layer 19, which consists of undoped quartz glass and has a wall thickness of 0.1 to 3 mm, preferably 0.5 mm.

After removing the auxiliary material—in this example the graphite rod—a treatment and/or cleaning and/or temperature treatment of the inner surface is performed. One or more stretching processes may then be carried out.

Subsequently, the desired refractive index structure is applied by inside deposition processes, for example MCVD or plasma inside vapor deposition (PIVD). After completing the inside deposition, a temperature treatment and/or elongating process may be carried out. The resulting product is jacketed after preparing the outer surface with at least one tube having desired refractive index and wall thickness or deposited with additional layers of desired refractive index and wall thickness by means of direct deposition processes. This results in the correct core to clad ratio of the optical fiber. It will be understood by one of skill in the art that the sequence of the single processing steps and deposition parameters, e.g. refractive index, wall thickness, diameter data, layer number and sequence, given in the examples can be adapted according to the application.

The method was described based on exemplary embodiments. Further embodiments result from the dependent claims and in the course of deviations obvious to the person skilled in the art.

FIGURE LIST

1 cladding tube
2 inside
3 protective, intermediate and barrier layer
4 outside
5 lightguiding layers
6 inner lightguiding layer
7 outer lightguiding layers
8 core rod
9 middle cladding tube
10 outer cladding tube
11 inner protective layer
12 first doped trench
13 intermediate layer
14 fluorine doped trench
15 outer protective layer
16 first doped trench
17 intermediate layer
18 fluorine doped trench
19 outer protective layer It is to be understood that the above-identified embodiments are simply illustrative of the principles of the invention. Various and other modifications and changes may be made by those skilled in the art which will embody the principles of the invention and fall within the spirit and scope thereof.

We claim:

1. A method for manufacturing a semi-finished optical product for a bend-optimized optical fiber, comprising:
   providing a cladding tube having an inner surface and an outer surface;
   forming a protective layer on the cladding tube;
   forming a light-guiding layer on the protective layer; and
   collapsing the cladding tube onto a substrate to form the semi-finished optical product.

2. The method of claim 1 further comprising:
   providing a plurality of cladding tubes; and
   wherein the step of collapsing further comprises collapsing the plurality of cladding tubes onto the substrate.

3. The method of claim 1 wherein the cladding tube is a fluorine-doped quartz glass tube.

4. The method of claim 1 wherein the step of forming the light-guiding layer further comprises depositing the light-guiding layer using a process selected from the group consisting of CVD, PIVD, OVD, flame pyrolysis or combinations thereof.

5. The method of claim 1 wherein the cladding tube has a melting point and wherein the protective layer is formed of quartz glass having a higher melting point than the melting point of the cladding tube.

6. The method of claim 1 wherein the protective layer operates as a diffusion barrier to volatile glass compounds.

7. The method of claim 1 wherein the protective layer is formed of at least one transition glass having a chemical composition tuned to minimize effects of differences between the semi-finished product and a substrate.

8. The method of claim 1 further comprising forming a second protective layer on the light-guiding layer.

9. The method of claim 1 further comprising controlling pressure on the inner and outer surfaces of the cladding tube.

10. The method of claim 1 further comprising mechanical processing the semi-finished product to form a polygonal rod.

11. The method of claim 1 further comprising collapsing a second cladding tube onto the semi-finished product, wherein the semi-finished product has a first chemical composition profile and wherein the second cladding tube has a second chemical composition profile, and wherein the first chemical composition profile and second chemical composition profile form, when combined, a structured profile, the structured profile being one selected from the group consisting of a constant profile, a linear profile, and a gradual profile.

12. The method of claim 1 further comprising performing an outer deposition on the cladding tube.

13. The method of claim 1 further comprising removing a part of the protective layer.

14. The method of claim 1 further comprising surface treating the cladding tube.

15. The method of claim 1 wherein the protective layer is formed on the inner surface of the cladding tube.

16. The method of claim 1 wherein the protective layer is formed on the outer surface of the cladding tube.

17. The method of claim 1 wherein the collapsing step further comprises partially collapsing the cladding tube.

\* \* \* \* \*